United States Patent
Li et al.

(10) Patent No.: US 8,228,752 B2
(45) Date of Patent: Jul. 24, 2012

(54) MEMORY CIRCUIT AND METHOD FOR CONTROLLING MEMORY CIRCUIT

(75) Inventors: Hung-Yu Li, Pingtung County (TW); Wade Wang, Suzhou Industrial Park (CN); Rick Zheng, Suzhou Industrial Park (CN); James Ma, Suzhou Industrial Park (CN); Kun-Ti Lee, Hsinchu County (TW); Chia-Cheng Chen, Taichung County (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 194 days.

(21) Appl. No.: 12/776,441

(22) Filed: May 10, 2010

(65) Prior Publication Data

US 2011/0273951 A1 Nov. 10, 2011

(51) Int. Cl.
*G11C 5/14* (2006.01)

(52) U.S. Cl. .............. 365/226; 365/189.07; 365/198.08; 365/230.05

(58) Field of Classification Search .................. 365/226, 365/189.07, 189.08, 230.05
See application file for complete search history.

(56) References Cited

U.S. PATENT DOCUMENTS

| 5,581,550 | A | | 12/1996 | Boyer et al. |
| 5,959,913 | A | * | 9/1999 | Raad .............................. 365/201 |
| 6,064,620 | A | * | 5/2000 | Mobley ..................... 365/230.03 |
| 6,353,569 | B1 | * | 3/2002 | Mizuno et al. ............. 365/210.1 |
| 6,493,788 | B1 | * | 12/2002 | Sun et al. ....................... 711/103 |
| 6,661,714 | B2 | * | 12/2003 | Lee ............................ 365/189.11 |
| 7,110,317 | B2 | * | 9/2006 | Song et al. ..................... 365/226 |
| 7,558,140 | B2 | * | 7/2009 | Fasoli et al. ................... 365/207 |
| 7,636,267 | B2 | * | 12/2009 | Okada ........................... 365/205 |

* cited by examiner

*Primary Examiner* — Pho M Luu
(74) *Attorney, Agent, or Firm* — Winston Hsu; Scott Margo

(57) ABSTRACT

A memory circuit includes a first memory array, a second memory array and a switch module, wherein the first memory array has a first node and a second node, the second memory array has a third node and a fourth node, the first node is coupled to a first supply voltage, and the fourth supply voltage is coupled to a second supply voltage smaller than the first supply voltage. The switch module is coupled to the second node, the third node, the first supply voltage and the second supply voltage. When the memory circuit is operated under an inactive mode, the switch module electrically connects the second node to the third node, electrically disconnects the second node from the second supply voltage, and electrically disconnects the third node from the first supply voltage.

18 Claims, 10 Drawing Sheets

MEMORY CIRCUIT AND METHOD FOR CONTROLLING MEMORY CIRCUIT

BACKGROUND OF THE INVENTION

1. Field of the Invention

The present invention relates to a memory circuit, and more particularly, to a memory circuit and a method for controlling the memory circuit which can reduce leakage current.

2. Description of the Prior Art

Please refer to FIG. 1, which is a diagram illustrating a prior art SRAM (Static Random Access Memory) unit 100. As shown in FIG. 1, the SRAM unit 100 includes six transistors N1-N4 and P1-P2, and data can be written into or read from the SRAM unit 100 by switching voltage levels of a word line WL, a bit line BL and a complementary bit line $\overline{BL}$. Because a person skilled in this art should understand the operations of the SRAM unit 100, further descriptions are omitted here.

Still referring to FIG. 1, when the SRAM unit 100 is operated under an inactive mode (i.e., the transistors N3 and N4 are switched off), voltage levels of the nodes A and B will be shifted due to the leakage current, and a reading error may occur when reading data from the SRAM unit 100. For example, assuming that the SRAM 100 is operated under the inactive mode and the voltage levels of the nodes A and B are VDD and VSS, respectively, there are two leakage current paths that exist between the node A and a supply voltage source VSS, which are, respectively, a sub-threshold leakage current generated by the transistor N1 and a gate leakage current generated by the transistor N2. Similarly, there are two leakage current paths that exist between the node B and a supply voltage source VDD, which are, respectively, a sub-threshold leakage current generated by the transistor P2 and a gate leakage current generated by the transistor P1. In addition, in deep sub-micro processes, these leakage currents will be increased exponentially, and may even become a main power consumption of the integrated circuit.

In order to solve the above-mentioned leakage current issue of the SRAM unit 100, U.S. Pat. No. 7,110,317 discloses a technique which can reduce the leakage current. Referring to the SRAM unit 501 shown in FIG. 2 of the U.S. Pat. No. 7,110,317, transistors P1 and P2 are connected to a supply voltage source VDD via a bias circuit 510 including transistors 511-513, and transistors N1 and N2 are connected to a supply voltage source VSS via a bias circuit 520 including transistors 521-523. When the SRAM unit 501 is operated under the inactive mode, the actual supply voltages of the SRAM unit 501 are (VDD−Vth) and (VSS+Vth), where Vth is a threshold voltage of the transistors 512-513 and 522-523. Therefore, the leakage current of the SRAM unit 501 can be effectively reduced because of a lower potential difference between the nodes A, B and the actual supply voltages. However, the threshold voltage of the transistors may be shifted due to variations of process, voltage and temperature (PVT), thereby influencing the supply voltages levels of the SRAM unit 501 when operated in the inactive mode, and causing data loss in the SRAM unit 501.

In addition, U.S. Pat. No. 5,581,500 also discloses a technique to reduce the leakage current. Referring to the SRAM unit 10 shown in FIG. 3 of U.S. Pat. No. 5,581,500, the SRAM unit 10 includes a (VSS+Δ) generator 30. When the SRAM unit 10 is operated under the inactive mode, a voltage level of a node A shown in FIG. 3 is (VSS+Δ). This means the leakage current can be improved because a voltage difference between the node A and nodes of the inverters 12 and 14 having a higher voltage is lowered. However, an SRAM array using the technique of U.S. Pat. No. 5,581,500 requires a higher manufacturing cost because each row of the SRAM array needs a (VSS+Δ) generator 30. Furthermore, the (VSS+Δ) generator 30 itself may have the leakage current.

SUMMARY OF THE INVENTION

It is therefore an objective of the present invention to provide a memory circuit and a method for controlling a memory circuit, which can effectively reduce the leakage current and have a higher process, voltage and temperature (PVT) tolerance, to solve the above-mentioned problems.

According to one embodiment of the present invention, a memory circuit comprises a first memory array, a second memory array and a switch module, where the first memory array comprises a first node and a second node, the second memory array comprises a third node and a fourth node, the first node is coupled to a first supply voltage, the fourth node is coupled to a second supply voltage which is smaller than the first supply voltage, and the switch module is coupled to the second node, the third node, the first supply voltage and the second supply voltage. When the memory circuit is operated under an inactive mode, the switch module electrically connects the second node to the third node, electrically disconnects the second node from the second supply voltage, and electrically disconnects the third node from the first supply voltage.

According to another embodiment of the present invention, a method for controlling a memory circuit is disclosed, where the memory circuit comprises a first memory array, and a second memory array, where the first memory array comprises a first node and a second node, the second memory array comprises a third node and a fourth node, the first node is coupled to a first supply voltage, and the fourth node is coupled to a second supply voltage which is smaller than the first supply voltage. The method comprises: when the memory circuit is operated under an inactive mode, electrically connecting the second node to the third node, electrically disconnecting the second node from the second supply voltage, and electrically disconnecting the third node from the first supply voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
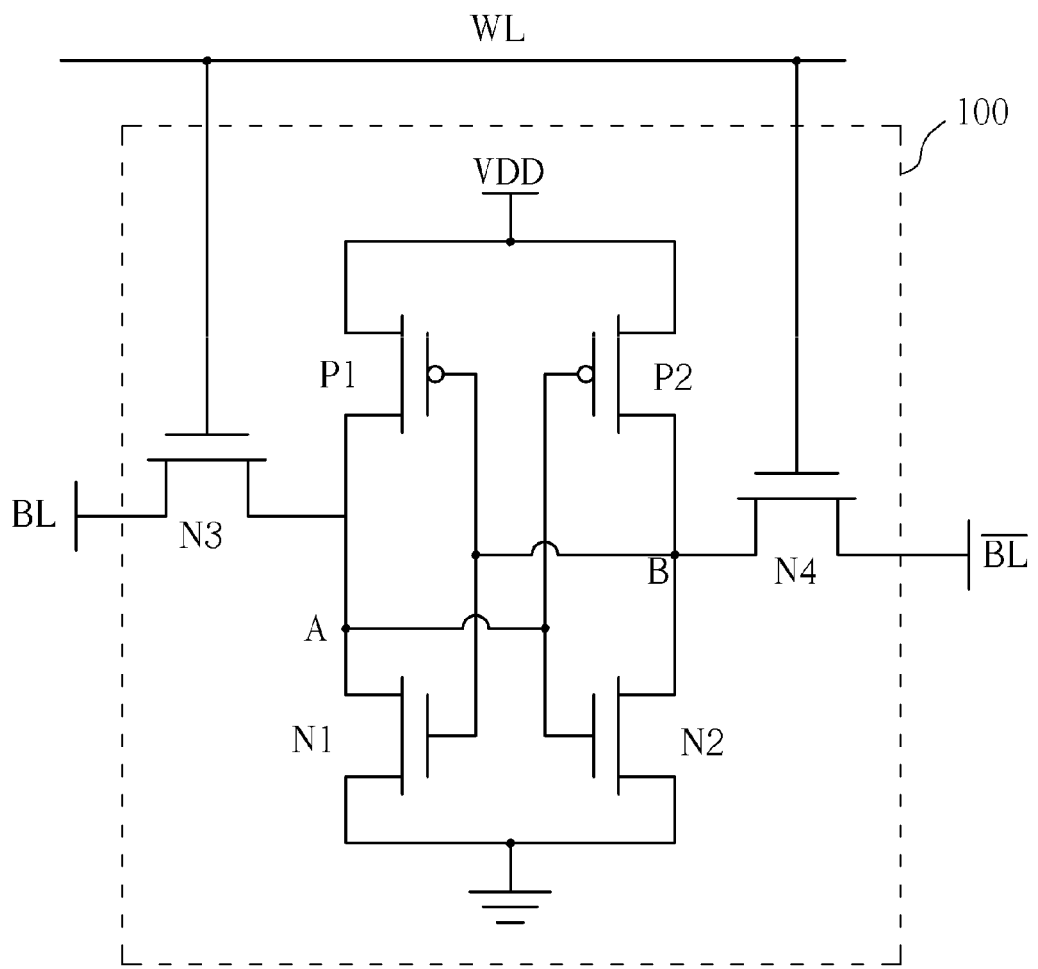
FIG. 1 is a diagram illustrating a prior art SRAM unit.
Figure 2:
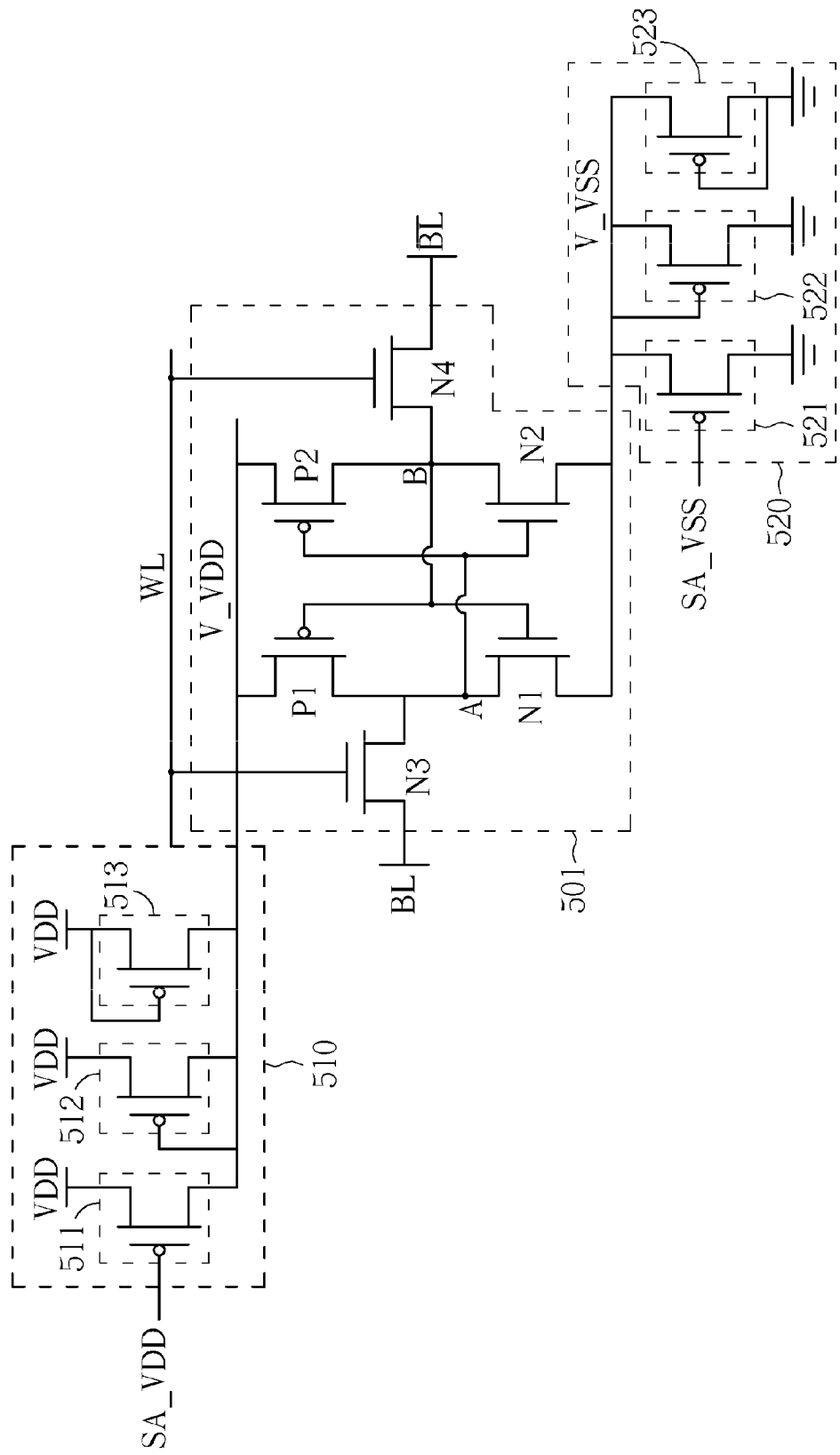
FIG. 2 is an SRAM unit described in U.S. Pat. No. 7,110,317.
Figure 3:
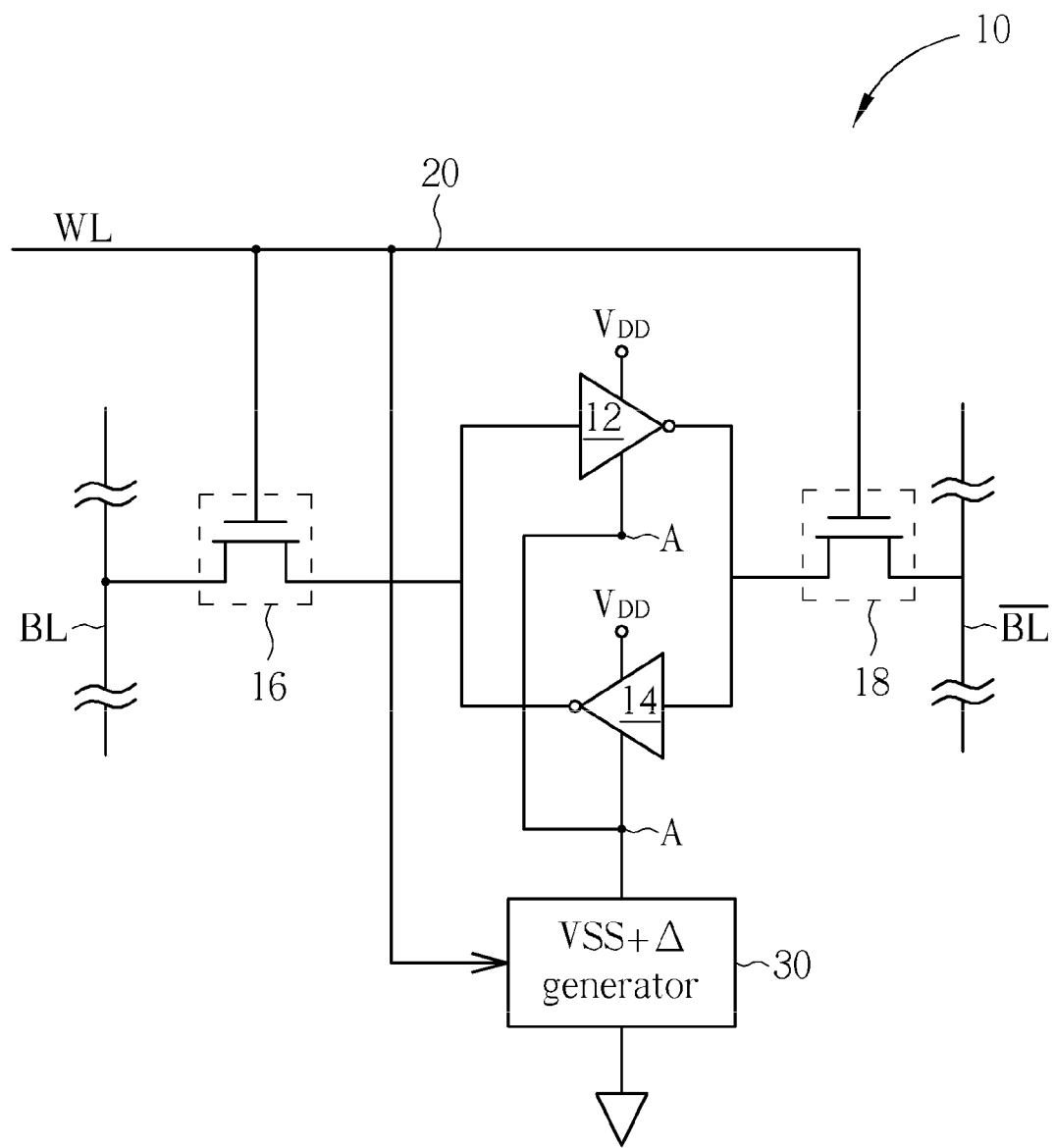
FIG. 3 is an SRAM unit described in U.S. Pat. No. 5,581,500.
Figure 4:
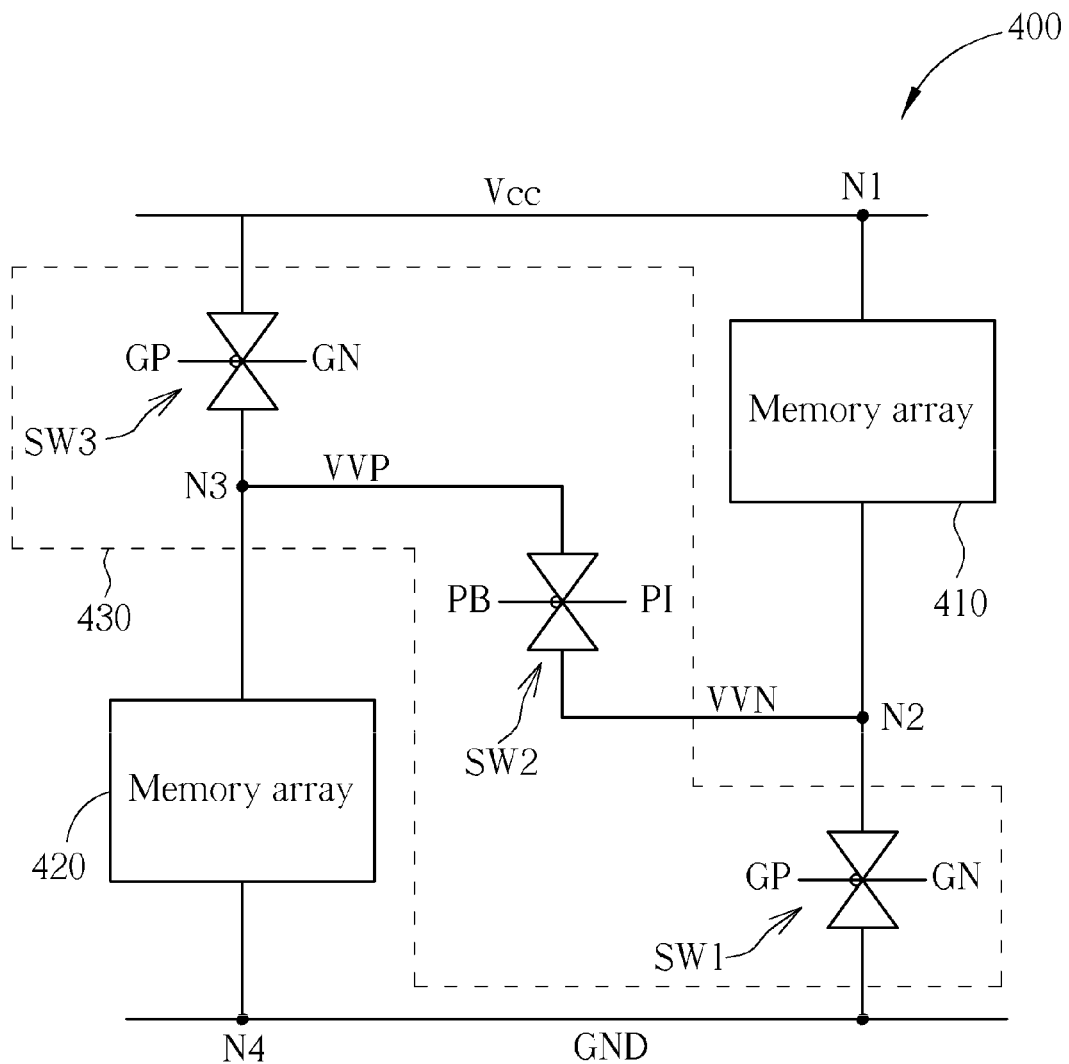
FIG. 4 is a diagram illustrating a memory circuit according to one embodiment of the present invention.

Please refer to FIG. 4. FIG. 4 is a diagram illustrating a memory circuit 400 according to one embodiment of the present invention. As shown in FIG. 4, the memory circuit 400 comprises memory arrays 410 and 420 and a switch module 430, where the memory array comprises a first node N1 and a second node N2, the memory array 420 comprises a third node N3 and a fourth node N4, and the switch module 430 comprises three switches SW1, SW2 and SW3. In addition, the node N1 is coupled to a supply voltage Vcc, the node N4 is couple to a supply voltage GND, the switch SW1 is coupled between the node N2 and the supply voltage GND, the switch SW2 is coupled between the node N2 and the node N3, and the switch SW3 is coupled between the node N3 and the supply voltage Vcc. In addition, in this embodiment, the memory arrays 410 and 420 are SRAM arrays; that is the memory arrays 410 and 420 comprise a plurality of SRAM units. Each SRAM unit of the memory arrays 410 and 420 is similar to the SRAM unit shown in FIG. 1, but the transistors N1 and N2 of the SRAM units of the memory array 410 are connected to the node N2 rather than directly connected to the supply voltage GND, and the transistors P1 and P2 of the SRAM units of the memory array 420 are connected to the node N3 rather than directly connected to the supply voltage Vcc.

In addition, in the memory circuit 400 shown in FIG. 4, the switches SW1, SW2 and SW3 are CMOS (Complementary Metal-Oxide Semiconductor) transmission gates, switching states of the switches SW1 and SW3 are controlled by control signals GP and GN, and a switching state of the switch SW2 is controlled by control signals PI and PB.

Figure 5:
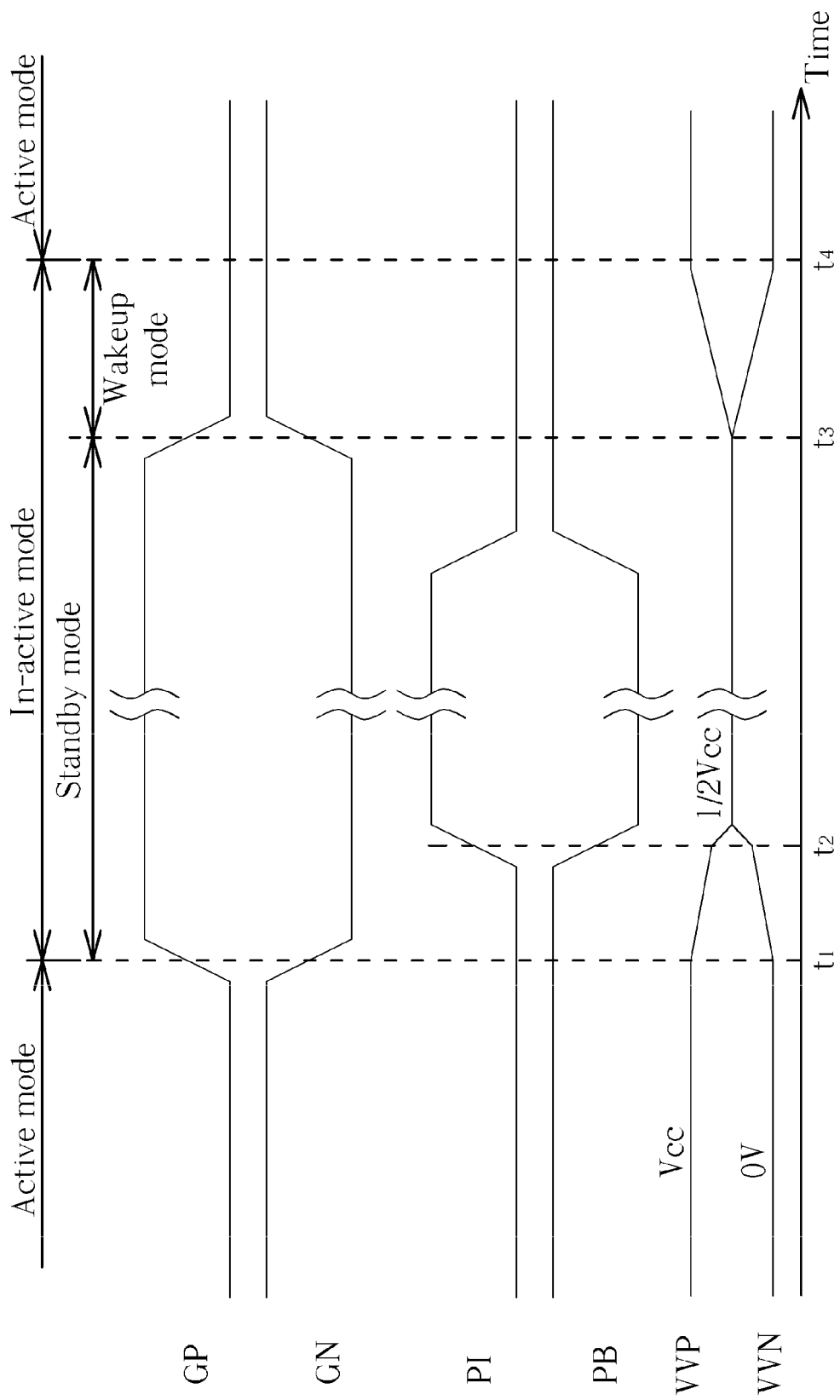
FIG. 5 shows states of the control signals GP, GN, PI and PB, a voltage level VVN of the node N2 and a voltage level of the node N3 when the memory circuit 400 is operated under an active mode and an inactive mode.
Figure 6:
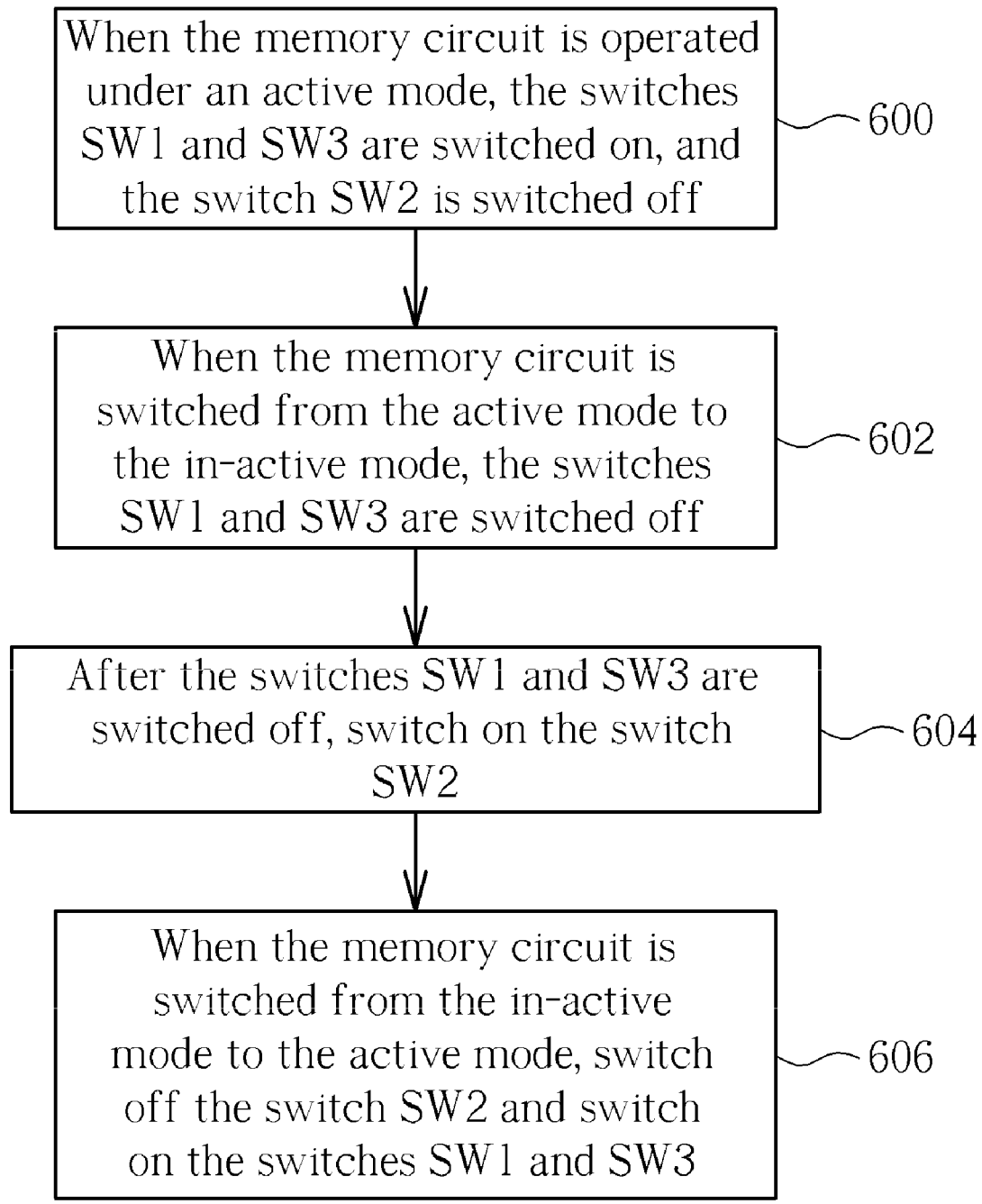
FIG. 6 is a flowchart of a method for controlling the memory circuit according to one embodiment of the present invention.

Please refer to FIG. 4, FIG. 5 and FIG. 6 together. FIG. 5 shows states of the control signals GP, GN, PI and PB, a voltage level VVN of the node N2 and a voltage level VVP of the node N3 when the memory circuit 400 is operated under an active mode and an inactive mode. FIG. 6 is a flowchart of a method for controlling the memory circuit 400 according to one embodiment of the present invention. Please note that, provided the result is substantially the same, the steps are not limited to be executed according to the exact order shown in FIG. 6. Referring to FIGS. 4-6, the flow is described as follows:

First, it is assumed that the memory circuit 400 is operated under an active mode; that is the memory circuit 400 is accessed. Then in Step 600, a control signal generator (not shown) generates the control signals GP, GP, PI and PB to control the switching states of the switches SW1, SW2 and SW3. At this time, the control signals GP and PI are low voltage levels, and the control signals GN and PB are high voltage levels, therefore the switches SW1 and SW3 are switched on and the switch SW2 is switched off, the voltage level VVN of the node N2 is at a low voltage level (GND) and the voltage level VVP of the node N3 is at a high voltage level (Vcc).

In Step 602, the operation mode of the memory circuit 400 is switched to a standby mode (i.e., at the time $t_1$ shown in FIG. 5). At this time, the control signal GP becomes a high voltage level and the control signal GN becomes a low voltage level to switch off the switches SW1 and SW3 (i.e., electrically disconnecting the node N2 from the supply voltage GND, and electrically disconnecting the node N3 from the supply voltage Vcc).

Figure 7:
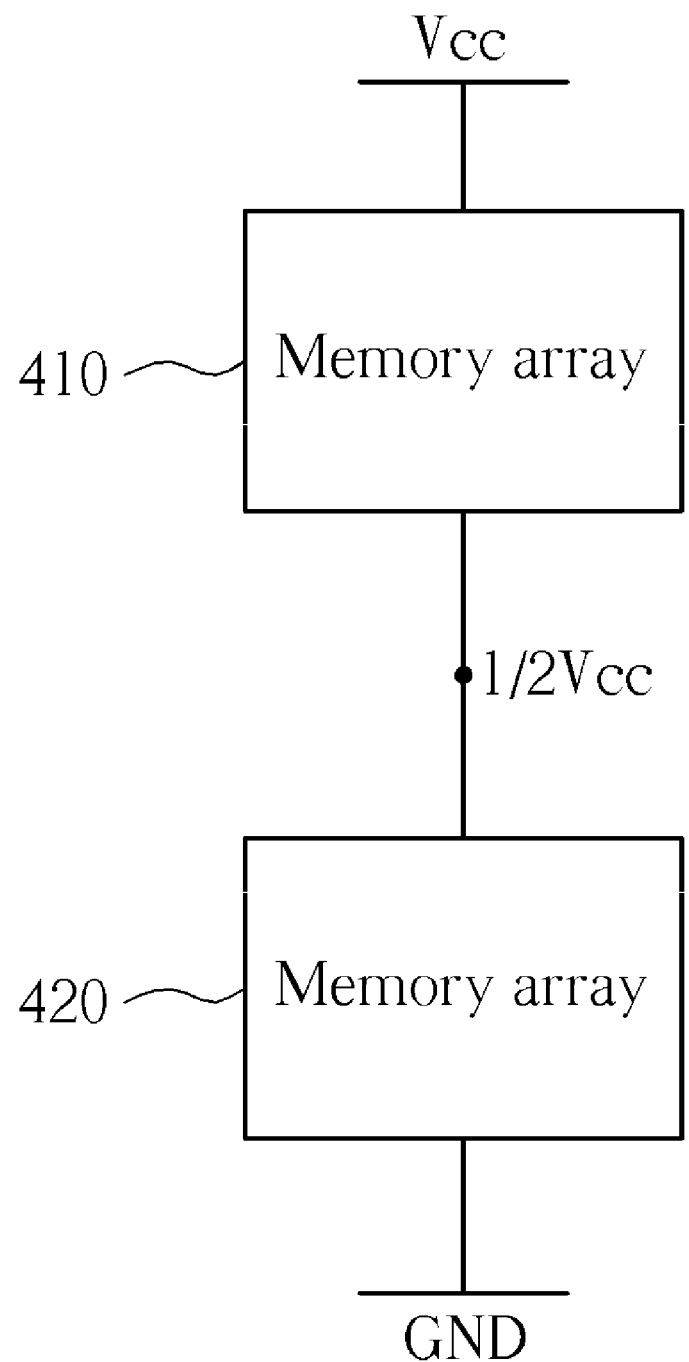
FIG. 7 is an equivalent circuit of the memory circuit shown in FIG. 4 when the memory circuit is operated under an inactive mode.

Then, in Step 604, at the time $t_2$ shown in FIG. 5, the control signal PI becomes a high voltage level and the control signal PB becomes a low voltage level to switch on the switch SW2 (i.e., electrically connecting the node N2 and the node N3). After the switch SW2 is switched on, the voltage levels of the nodes N2 and N3 gradually approach 0.5*Vcc. At this time, the equivalent circuit of the memory circuit 400 can be shown in FIG. 7 which shows that a voltage difference between the nodes N1 and N2, and a voltage difference between the nodes N3 and N4 are both 0.5*Vcc, meaning that a rail-to-rail voltage of each SRAM unit within the memory arrays 410 and 420 is equal to 0.5*Vcc. Therefore, the leakage current of the SRAM unit can be effectively reduced.

In Step 606, the operation mode of the memory circuit 400 is prepared to be switched from the inactive mode to the active mode. At this time, the control signals PI and PB are switched to a low voltage level and a high voltage level, respectively, and then the control signals GP and GN are switched to a low voltage level and a high voltage level, respectively, to switch on the switches SW1 and SW3 to make the memory circuit 400 enter a wakeup mode (at time $t_3$ shown in FIG. 5). After a period following the memory circuit 400 entering the wakeup mode, the voltage level VVN of the node N2 becomes the low voltage level (GND), and the voltage level VVP of the node N3 becomes the high voltage level (Vcc). At this time, the memory circuit 400 enters the active mode (at time $t_4$ shown in FIG. 5).

Figure 8:
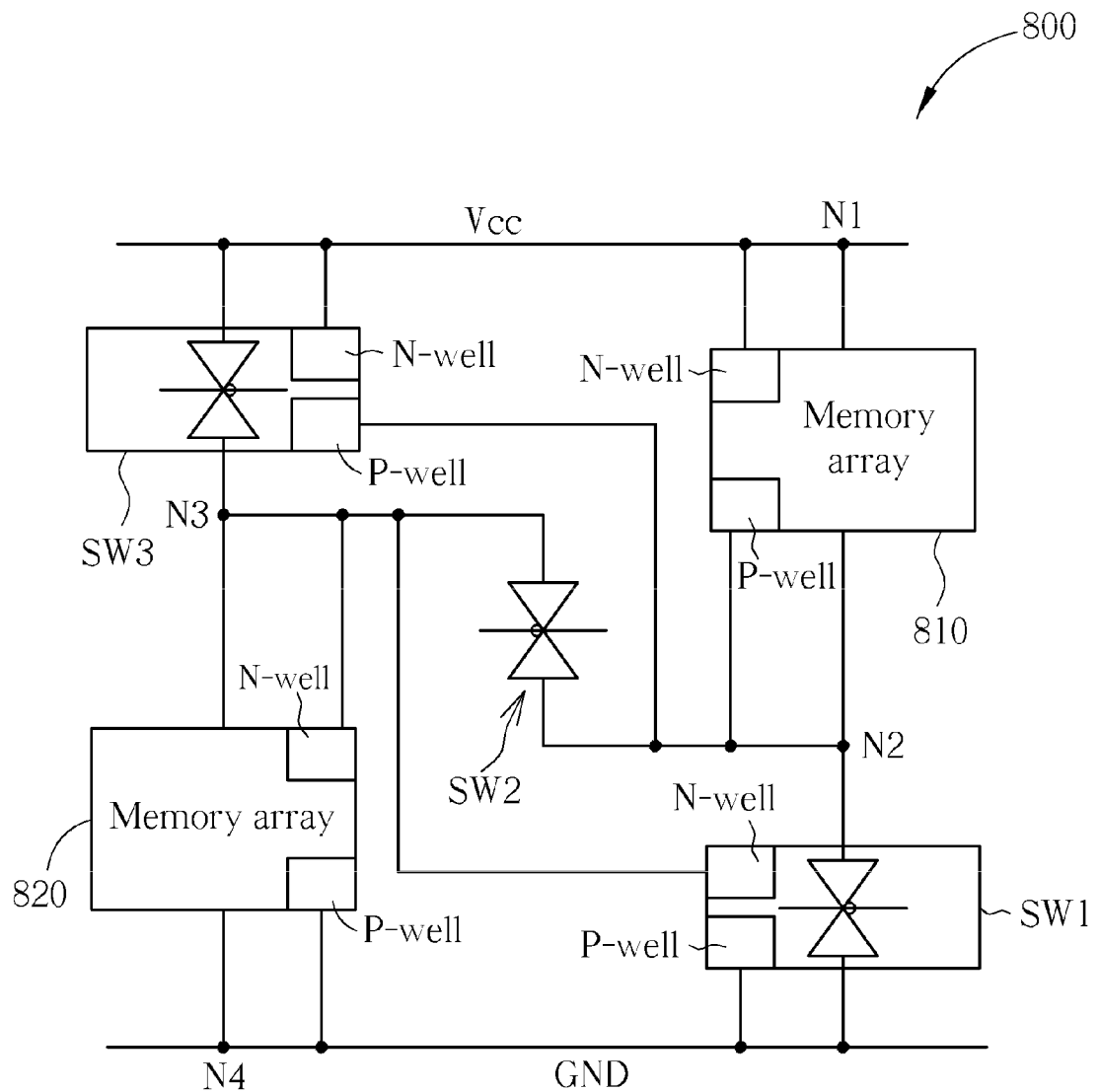
FIG. 8 is a diagram illustrating a memory circuit according to another embodiment of the present invention.

In addition, to eliminate the body effect, FIG. 8 shows a memory circuit 800 according to another embodiment of the present invention. The memory circuit 800 shown in FIG. 8 is similar to the memory circuit 400 shown in FIG. 4, apart from the connections of the N-well/P-well of each MOS (Metal-Oxide Semiconductor) within the memory circuit. As shown in FIG. 8, the N-well and the P-well of each MOS within the memory array 810 are connected to the supply voltage Vcc and the node N2, respectively; the N-well and the P-well of each MOS within the memory array 820 are connected to the node N3 and the supply voltage GND, respectively; the P-well and the N-well of the switch SW1 are connected to the supply voltage GND and the node N3, respectively; and the N-well and the P-well of the switch SW3 are connected to the supply voltage Vcc and the node N2, respectively.

In addition, in the memory circuit 400 shown in FIG. 4, the switches SW1, SW2 and SW3 are CMOS transmission gates. In other embodiments, however, the switches SW1, SW2 and SW3 can be implemented by any other semiconductor element which has a switching function. These alternative designs also fall within the scope of the present invention.

In addition, in the embodiments shown in FIGS. 4-6, when the operation mode of the memory circuit 400 is switched from the active mode to the inactive mode, the switches SW1 and SW3 are switched off (at time $t_1$ shown in FIG. 5) prior to the switch SW2 being switched on (at time $t_2$ shown in FIG. 5) to prevent the overshoot/undershoot and current spike issues which may influence the data stored in the memory arrays 410 and 420, as, during the period between the times $t_1$ and $t_2$, the voltage level VVN of the node N2 and the voltage level VVP of the node N3 will gradually approach each other due to the leakage current. Furthermore, there are at least two methods for determining when to switch on the switch SW2 (i.e., how to determine the time $t_2$): the first method is that the switch SW2 is switched on after a fixed period starting from when the switches SW1 and SW3 are switched off; i.e. a difference between the times $t_1$ and $t_2$ is a constant value; and the second method is to use a detecting circuit to detect a voltage level of at least one of the nodes N2 and N3 to determine when to switch on the switch SW2. How to use the detecting circuit to determine when to switch on the switch SW2 is described in the following paragraph.

Figure 9:
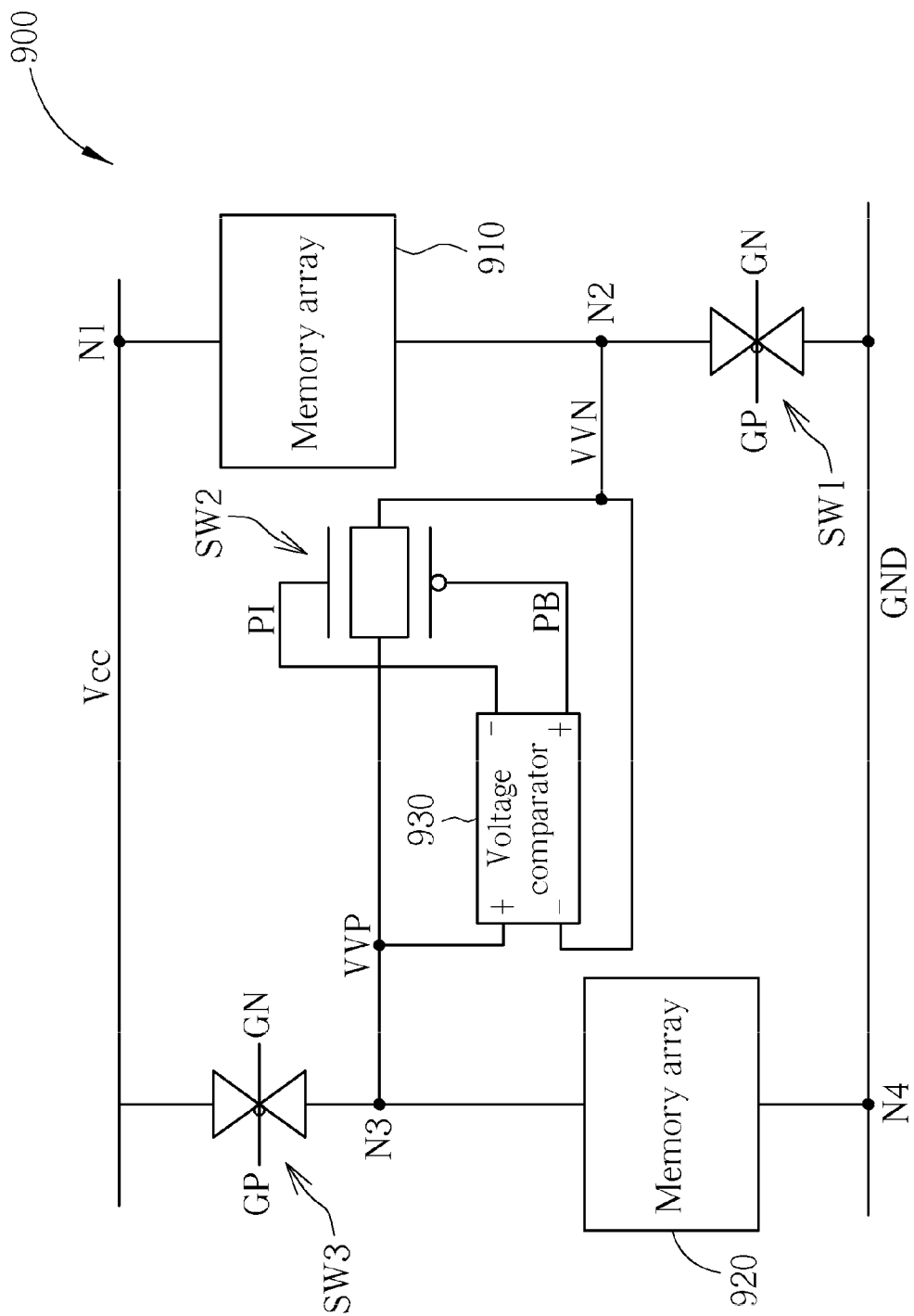
FIG. 9 is a diagram illustrating a memory circuit according to another embodiment of the present invention.

Please refer to FIG. 9. FIG. 9 is a diagram illustrating a memory circuit 900 according to another embodiment of the present invention. As shown in FIG. 9, the memory circuit 900 comprises memory arrays 910 and 920, a detecting circuit (in this embodiment, a voltage comparator 930 serves as the detecting circuit), and three switches SW1, SW2 and SW3, where the memory array 910 has a first node N1 and a second node N2, and the memory array 920 has a third node N3 and a fourth node N4. In addition, the node N1 is coupled to a supply voltage Vcc, the node N4 is coupled to a supply voltage GND, the switch SW1 is coupled between the node N2 and the supply voltage GND, the switch SW2 is coupled between the nodes N2 and N3, and the switch SW3 is coupled between the node N3 and the supply voltage Vcc.

The memory circuit 900 is similar to the memory circuit 400 shown in FIG. 4, but the control signals PI and PB are generated from the voltage comparator 930 by comparing the voltage levels VVN and VVP of the nodes N2 and N3. In detail, when the voltage level VVP is greater than the voltage level VVN, the control signals PI and PB generated from the voltage comparator 930 are low voltage level and high voltage level, respectively, i.e. the switch SW2 is switched off. When the voltage level VVP is smaller than the voltage level VVN, the control signals PI and PB generated from the voltage comparator 930 are high voltage level and low voltage level, respectively, i.e. the switch SW2 is switched on.

Figure 10:
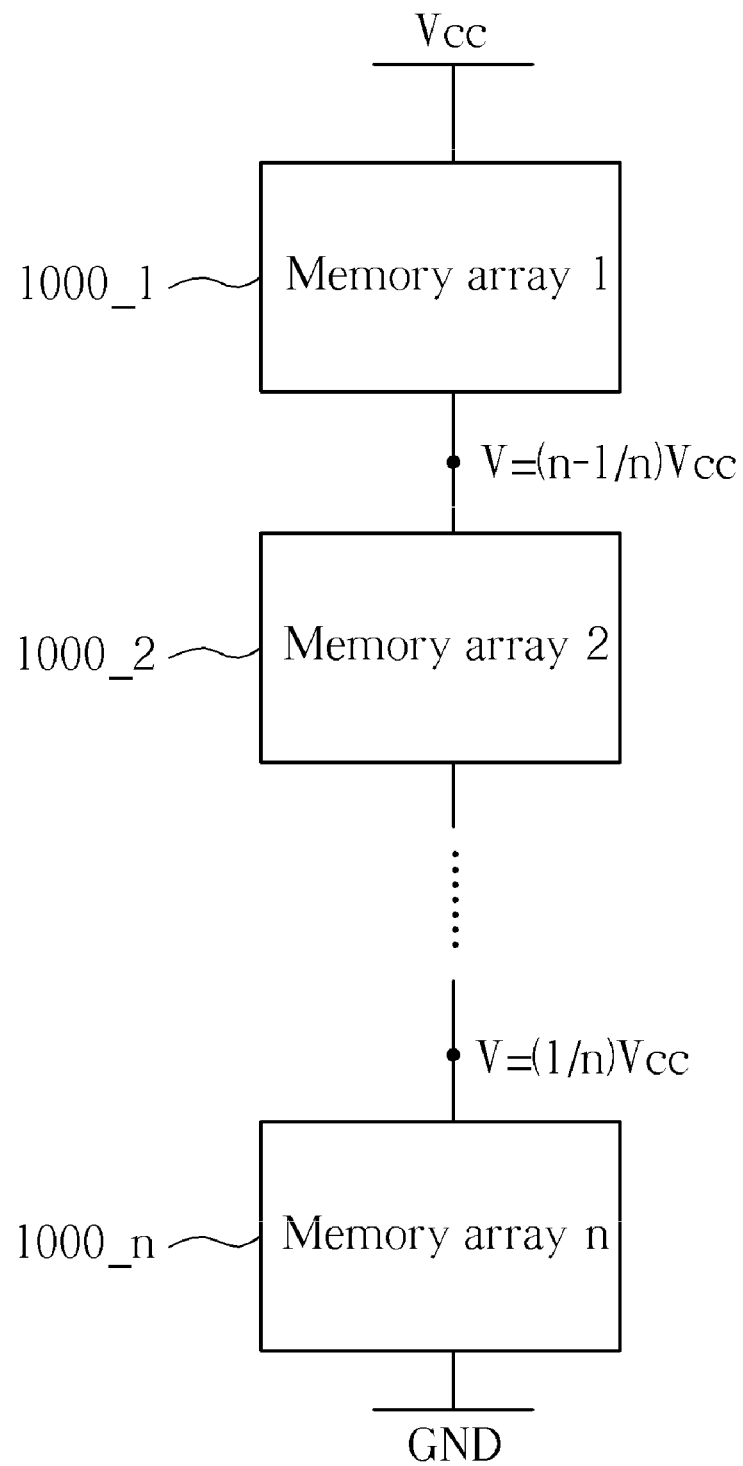
FIG. 10 is an equivalent circuit of the memory circuit which comprises n memory arrays when the memory circuit is operated under an inactive mode.

In addition, each memory circuit shown in FIGS. 4, 8 and 9 shows two memory arrays. In other embodiments, however, the memory circuit can comprise more than two memory arrays. As long as, when the memory circuit is operated under an inactive mode, its equivalent circuit can be a plurality of memory arrays 1000_1-1000_n cascaded in series as shown in FIG. 10 to make a voltage difference between the actual supply voltages of each memory array be $(1/n)*Vcc$, these alternative designs also fall within the scope of the present invention.

Briefly summarized, in the memory circuit and the method for controlling the memory circuit of the present invention, when the memory circuit is operated under an inactive mode, two memory arrays are cascaded in series to make a voltage difference between the two actual supply voltages of each memory array be half the value of when the memory circuit is operated under an active mode. Therefore, the leakage current of each memory unit can be effectively reduced when the memory circuit is operated under the inactive mode. In addition, the memory circuit of the present invention has a simple structure, and has a higher PVT tolerance.

Those skilled in the art will readily observe that numerous modifications and alterations of the device and method may be made while retaining the teachings of the invention.

What is claimed is:

1. A memory circuit, comprising:
a first memory array, comprising a first node and a second node, wherein the first node is coupled to a first supply voltage;
a second memory array, comprising a third node and a fourth node, wherein the fourth node is coupled to a second supply voltage smaller than the first supply voltage; and
a switch module, coupled to the second node of the first memory array, the third node of the second memory array, the first supply voltage and the second supply voltage;
wherein when the memory circuit is operated under an inactive mode, the switch module electrically connects the second node to the third node, electrically disconnects the second node from the second supply voltage to make the first memory array not directly supplied by the second supply voltage, and electrically disconnects the third node from the first supply voltage to make the second memory array not directly supplied by the first supply voltage.

2. The memory circuit of claim 1, wherein when the memory circuit is operated under an active mode, the switch module electrically disconnects the second node from the third node, electrically connects the second node to the second supply voltage to make the first memory array directly supplied by the second supply voltage, and electrically connects the third node to the first supply voltage to make the second memory array directly supplied by the first supply voltage.

3. The memory circuit of claim 2, wherein the switch module comprises:
a first switch, coupled between the second node and the second supply voltage;
a second switch, coupled between the second node and the third node; and
a third switch, coupled between the third node and the first supply voltage.

4. The memory circuit of claim 3, wherein when the memory circuit is switched from the inactive mode to the active mode, the first switch and the third switch are switched from off to on, and the second switch is switched from on to off, wherein a time when the second switch is switched from on to off is prior to a time when the first switch and the third switch are switched from off to on.

5. The memory circuit of claim 3, wherein when the memory circuit is switched from the active mode to the inactive mode, the first switch and the third switch are switched from on to off, and the second switch is switched from off to on, wherein a time when the second switch is switched from off to on is later than a time when the first switch and the third switch are switched from on to off.

6. The memory circuit of claim 5, further comprising:
a detecting circuit, coupled to the second node, the third node and the second switch, for generating a control signal according to at least one voltage level of the second node and the third node to control the second switch.

7. The memory circuit of claim 6, wherein the detecting circuit compares a voltage level of the second node with a voltage level of the third node to generate the control signal.

8. The memory circuit of claim 7, wherein when the detecting circuit detects that the voltage level of the second node is greater than the voltage level of the third node, the detecting circuit generates the control signal to switch on the second switch.

9. The memory circuit of claim 3, wherein the first switch and the third switch are CMOS transmission gates, an N-well of the first switch is connected to the third node, and a P-well of the third switch is connected to the second node.

10. The memory circuit of claim 1, wherein the first memory array and the second memory array are SRAM arrays.

11. A method for controlling a memory circuit, wherein the memory circuit comprises a first memory array and a second memory array, the first memory array has a first node and a second node, the second memory array has a third node and a fourth node, the first node is coupled to a first supply voltage, and the fourth node is coupled to a second supply voltage smaller than the first supply voltage, and the method comprises:

when the memory circuit is operated under an inactive mode:
electrically connecting the second node to the third node;
electrically disconnecting the second node from the second supply voltage to make the first memory array not directly supplied by the second supply voltage; and
electrically disconnecting the third node from the first supply voltage to make the second memory array not directly supplied by the first supply voltage.

12. The memory of claim 11, wherein when the memory circuit is operated under an active mode, the method further comprises:
electrically disconnecting the second node from the third node;
electrically connecting the second node to the second supply voltage to make the first memory array directly supplied by the second supply voltage; and
electrically connecting the third node to the first supply voltage to make the second memory array not directly supplied by the first supply voltage.

13. The method of claim 12, further comprising:
when the memory circuit is switched from the inactive mode to the active mode, a time when the second node is electrically disconnected from the third node is prior to a time when the second node is connected to the second supply voltage, and the time when the second node is electrically disconnected from the third node is prior to a time when the third node is connected to the first supply voltage.

14. The method of claim 12, further comprising:
when the memory circuit is switched from the active mode to the inactive mode, a time when the second node is electrically connected to the third node is later than a time when the second node is disconnected from the second supply voltage, and the time when the second node is electrically connected to the third node is later than a time when the third node is disconnected from the first supply voltage.

15. The method of claim 14, further comprising:
generating a control signal according to at least one voltage level of the second node and the third node to control the second node to be electrically connected to or electrically disconnected from the third node.

16. The method of claim 15, wherein the step of generating the control signal according to at least one voltage level of the second node and the third node comprises:
comparing a voltage level of the second node with a voltage level of the third node to generate the control signal.

17. The method of claim 16, wherein when the voltage level of the second node is greater than the voltage level of the third node, generating the control signal to control the second node to be electrically connected to the third node.

18. The method of claim 11, wherein the first memory array and the second memory array are SRAM arrays.

* * * * *